United States Patent [19]

Ahern et al.

[11] Patent Number: 5,136,978

[45] Date of Patent: Aug. 11, 1992

[54] HEAT PIPE SUSCEPTOR FOR EPITAXY

[75] Inventors: Brain S. Ahern, Boxboro; David W. Weyburne, Maynard, both of Mass.

[73] Assignee: The United States of America as represented by The Secretary Of The Air Force, Washington, D.C.

[21] Appl. No.: 431,491

[22] Filed: Oct. 30, 1989

[51] Int. Cl.$^5$ ............................................. C23C 16/00
[52] U.S. Cl. .................................. 118/725; 118/728; 118/730
[58] Field of Search ..................... 118/725, 728, 730

[56] References Cited

U.S. PATENT DOCUMENTS

| | | | |
|---|---|---|---|
| 3,956,032 | 5/1976 | Powell | 156/610 |
| 4,147,571 | 4/1979 | Stringfellow | 118/725 |
| 4,419,332 | 12/1983 | von der Ropp | 422/245 |
| 4,534,312 | 8/1985 | Shinya | 118/725 |
| 4,596,208 | 6/1986 | Wolfson | 118/725 |
| 4,681,995 | 7/1987 | Ahern | 219/50.1 |
| 4,736,705 | 4/1988 | Weyburne | 118/725 |
| 4,778,559 | 10/1988 | McNeilly | 118/725 |
| 4,788,416 | 11/1988 | Price | 219/516 |
| 4,789,771 | 12/1988 | Robinson | 219/405 |
| 4,811,687 | 3/1989 | Prince | 118/725 |
| 4,821,674 | 4/1989 | de Boer | 118/666 |
| 4,834,022 | 5/1989 | Mahawilli | 118/725 |

Primary Examiner—Richard Bueker
Attorney, Agent, or Firm—Stanton E. Collier; Donald J. Singer

[57] ABSTRACT

The present invention is a heat pipe susceptor for use in a vapor deposition system. The multi-layered refractory material susceptor provides a highly uniform heated surface upon which wafers are placed for heating by a radio frequency (RF) source. Because of the highly uniform surface temperature, susceptors are able to hold a plurality of inch sized diameter wafers and the shape of the surfaces can be designed as the need arises. A cylindrically shaped top and a multi-faced frustum shaped top are examples.

3 Claims, 1 Drawing Sheet

HEAT PIPE SUSCEPTOR FOR EPITAXY

STATEMENT OF GOVERNMENT INTEREST

The invention described herein may be manufactured and used by or for the Government for governmental purposes without the payment of any royalty thereon.

BACKGROUND OF THE INVENTION

The present invention relates to epitaxial deposition and, in particular, relates to apparatus used in the deposition of the material.

Chemical vapor deposition (CVD) is one of the standard methods of manufacturing thin (epitaxial) crystalline layers. These layered structures are required in many semiconductor components including transistors and heterojunction lasers. During vapor deposition the reactants are introduced into a quartz tube reactor vessel, for example, in which a substrate is held by a substrate holder (susceptor). The susceptor is used to heat the substrate so that the reactants pyrolyze and deposit out onto the heated substrate. Typically, the reactants flow past the heated substrate at one end of the reaction vessel and are exhausted at a distant end. Heating is required for the vapor deposition crystal growth; since the walls of the reactor are relatively cool, the reactants should only pyrolyze at the heated substrate.

Problems that have arisen with conventional CVD reactors are a tendency towards non-uniform crystal growth due to variations in the reactant flow as it travels across the substrate and non-uniform heating of the substrate. Conventional MOCVD reactor flow channels attempt to obtain a well behaved, non-turbulent reactant flow by having a long entrance length and/or quartz inserts to shape the flow traveling across the substrate. Unfortunately, reactant gases can become depleted as they pass over the substrate and deposit unevenly, and also the perfection of the epitaxial layer depends upon several critical parameters and controlling the temperature of the substrate surface is one of these critical features. Advanced semiconductor materials are composed of two or more primary elements (i.e., GaAs, InP, CdTe, HgCdTe, GaInAlAs, etc.). Epitaxial deposition of binary, ternary and even quarternary layers are much more difficult than mono-elemental depositions normally encountered in silicon technology. These materials are much more sensitive to temperature variations. The layer thicknesses and electrical properties have been observed to vary by 100% across a two inch wafer that developed a mere 2 degree Centigrade per centimeter temperature gradient using conventional susceptors such as ones made of graphite.

SUMMARY OF THE INVENTION

The present invention comprises a reactor having a reactor vessel with at least one gas inlet for injecting vapor and a gas outlet for exhausting the gases from the reactor vessel after it has passed by at least one substrate. The substrate is held on a substrate holder being a susceptor and being a heat pipe which uniformly heats the substrate to promote uniform deposition. The susceptor is both rotatable and translatable. The heating of the heat pipe susceptor is accomplished by an RF source.

Therefore, one object of the present invention is to provide a susceptor being a heat pipe.

Another object of the present invention is to provide a heat pipe susceptor having a temperature uniformity substantially greater than conventional susceptors.

Another object of the present invention is to provide a heat pipe susceptor able to hold a plurality of wafers for processing.

A further object of the present invention is to provide a heat pipe susceptor capable of external heating thereto.

These and other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 1:
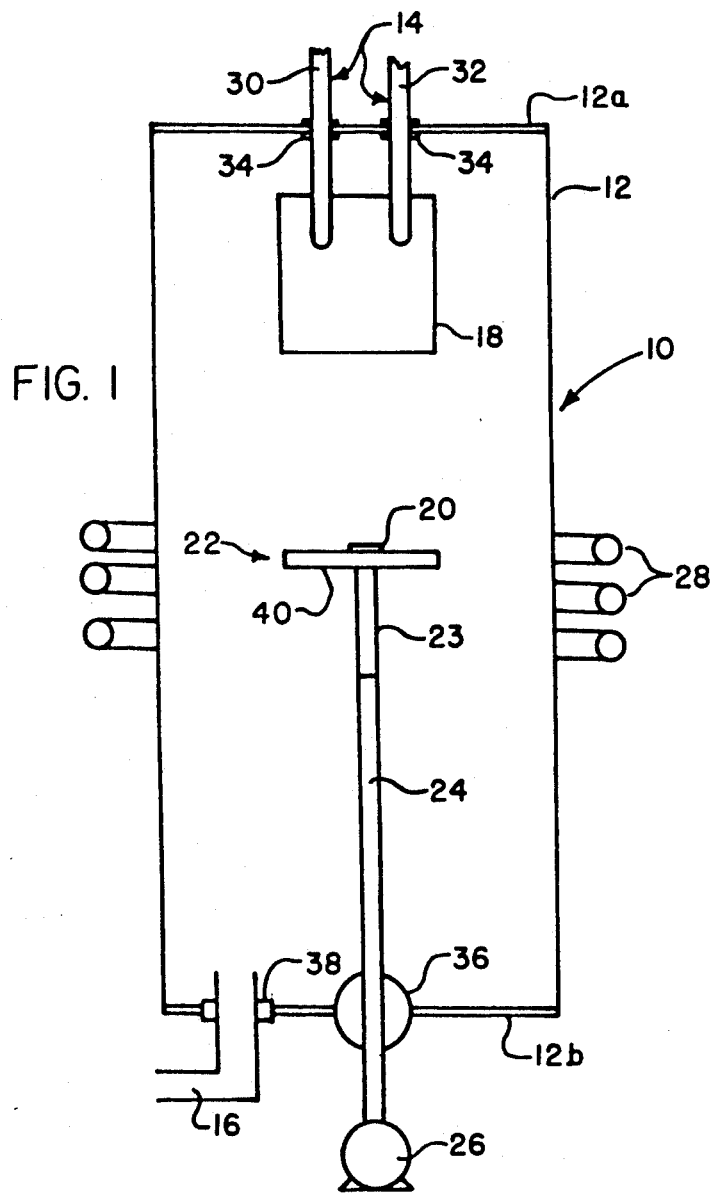
FIG. 1 illustrates a CVD reactor having one embodiment of the present invention therein.
Figure 2:
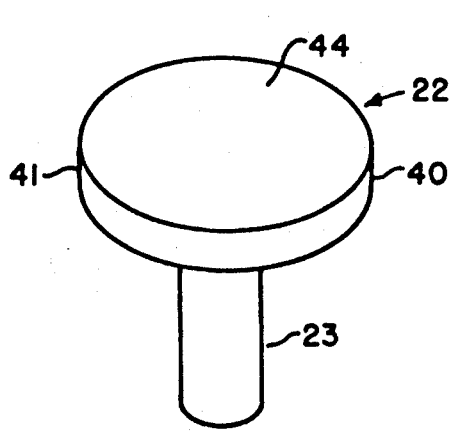
FIG. 2 illustrates one embodiment of the heat pipe susceptor of the present invention.
Figure 3:
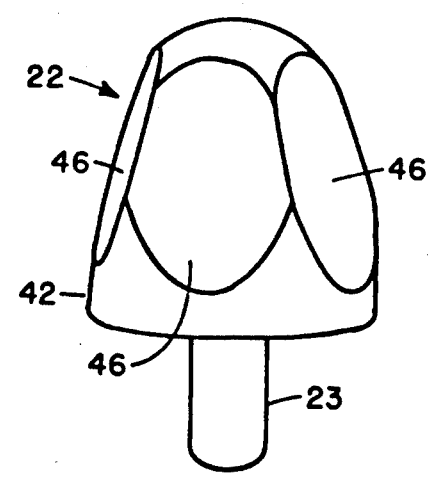
FIG. 3 illustrates another embodiment of the heat pipe susceptor of the present invention

Referring to FIG. 1, a reactor 10 comprises a reactor vessel 12 having gas inlets 14 and a gas exit 16. A gas delivery system 18 directs gas onto a substrate 20 positioned on a substrate holder 22. The substrate holder 22 includes a base 23 which is connected by a rod 24 to a motor 26 that is used to rotate and translate the substrate 20 during vapor deposition. The substrate holder 22 is a heat pipe susceptor 40 or 42 as shown in FIGS. 2 or 3 that is heated by a radio frequency source such as RF coils 28.

Operation of the reactor 10 is generally conventional; gas is introduced into the reactor by gas inlets 14 and delivered into the vicinity of the substrate 20 by an gas delivery system 18. The substrate 20 is heated by the substrate holder 22 to a temperature suitable for pyrolysing the reactants and promoting vapor deposition onto the substrate 20. Waste gas is removed through exit 16.

The reactor vessel 12 is typically cylindrical and has flat ends 12a and 12b. The reactor vessel 12 can be constructed either conventionally out of quartz or from stainless steel. Stainless steel increases the safety and decreases the cost and manufacturing difficulties inherent in conventional MOCVD systems.

Gas inlets 14 pass through seals 34 at reactor vessel 12 end 12a and is connected to the gas delivery system 18 near the substrate 20. The substrate 20 is rotatably supported by the substrate holder 22 and the rod 24 The support shaft 24 passes through a seal and bearing 36 at reactor end 12b. The exit 16 also passes through reactor end 12b and is sealed with seal 38. In some instances the entry and exit tubes can be welded or otherwise affixed to the rector ends in a manner that eliminates the need for separate seals 34 and 38.

The substrate holder 22 is preferably a heat pipe susceptor to be described hereinafter which can be heated by a radio frequency (RF) source. An RF source 28 surrounds the reactor vessel 12 at a location parallel to substrate holder 22 and susceptor 40. During vapor deposition the RF source 28 is activated to heat the susceptor 40 and thus the substrate 20. Typically the substrate is heated to 600 to 700 degrees Centigrade while the reactor wall temperature remains at about 200 to 300 degrees Centigrade. This high temperature is required to pyrolyze the reactants and promote uniform epitaxial growth. Little or no pyrolyzation should occur at the relatively cool reactor walls. The substrate holder 22 because of it unique construction can withstand temperatures between 400 to 1500 degrees Centigrade, for example, but this is only limited by the material of its construction.

The substrate holder 22 is maintained in position by rod 24. The rod 24 proceeds through the bearing 36 in reactor wall 12b to a conventional electric motor and stand 26. This electric motor is used during vapor deposition to rotate the substrate 20 underneath the gas delivery system 18 in order to promote uniform epitaxial growth.

In view of FIG. 1 the substrate 20 is centered upon the substrate holder, however, in some instances it may be desirable to place a number of substrates upon the substrate holder 22 for mass deposition or have the substrate holder offset relative to the gas delivery system 18. A series of substrates could then be rotated beneath the gas delivery system for sequential vapor deposition.

The operation of a metal organic chemical vapor deposition system is disclosed in U.S. Pat. No. 4,736,705 which is incorporated by reference. A graphite susceptor is used in this patent.

Referring to FIG. 2, the heat pipe susceptor 40 is shown. Susceptor 40 has as cylindrical top 41 with a flat upper surface 44 upon which wafers may be placed. The base 23 is also a heat pipe and an integral part of top 41. The top 41 may have a diameter of a foot or more to accommodate any number of wafers. The details of constructing this susceptor 40 shall be disclosed hereinafter In FIG. 3, a multi-faced susceptor 42 is shown Each angled face 46 may hold only one wafer. Clearly, the number of faces can be changed and the angle also to accommodate a particular deposition system.

The choice of heat pipe materials is dependent upon the deposition materials as well as the wafer substrate. For III-V and II-VI compounds, the choice of materials can be narrowed to a few refractory elements such as: Niobium, Hafnium, Tantalum, Molybdenum and Tungsten. These elements as well as their native nitrides, borides, carbides and oxides share important high temperature characteristics. Vapor deposition techniques now permit the fabrication of virtually any size and shape within these material families. Control of deposition parameters allows for tailoring of the chemical microstructures to provide high strength, toughness and resistance to chemical attach at elevated temperatures.

Fabrication techniques for constructing heat pipe susceptors include:

A. Machining of a mandrel into a desired shape;

B. Vapor deposition of selected refractory material(s) over the mandrel to form a first layer;

C. Removal of the mandrel by etching, melting or abrasion to leave the first layer having the shape of the mandrel;

D. Thoroughly cleaning the interior surfaces;

E. Admitting the working fluid. This can be accomplished by vacuum distillation, decanting or loading high purity solids F. Sealing the working fluids under high vacuum conditions; and G. Final deposition of remaining layers to prepare the outer surfaces for use in particular epitaxial conditions. This deposition may include a plurality of layers with spatially varying compositions.

The heat pipe susceptor 40 of FIG. 2 was heated with RF induction to 1100 degrees Centigrade and the top surface 44 was observed to be isothermal.

FIG. 3 shows the heat pipe susceptor mandrel for susceptor 42 that will hold 5, 2 inch wafers. The faces may be knurled to increase the wicking behavior of the molten working fluids. This mandrel may be plasma arc sprayed with 50 mils of Niobium. After loading the etched and cleaned interior with solid Cesium, the mandrel is sealed in high vacuum. The sealed heat pipe may then receive 10 mils of layered structures of Niobium and Niobium nitride. A final surface coating of alumina is an option to reduce oxidation. Most III-V compounds use hydrogen as a carrier gas. This epitaxial heat pipe will operate between 450 and 950 degrees Centigrade. Higher temperatures can be achieved by alloying the Cesium working fluid with Zinc.

Clearly, many modifications and variations of the present invention are possible in light of the above teachings and it is therefore understood, that within the inventive scope of the inventive concept, the invention may be practice otherwise than specifically claimed.

What is claimed is:

1. In an improved chemical vapor deposition system wherein the improvement comprises a radio frequency (RF) heating source and a heat pipe susceptor for holding a semiconductor substrate, said heating source being positioned externally from said heat pipe susceptor, said heat pipe susceptor having at least one surface for holding a substrate directly thereon, said surface having an area sufficient to hold at least one substrate directly thereon for uniform heating, said RF heating source vaporizing a fluid for providing heat distribution within said heat pipe susceptor to provide an isothermal surface for holding the semiconductor substrate, said heat pipe susceptor being operable in a temperature range from 400° C. to about 1500° C.

2. In an improved vapor deposition system as defined in claim 1 wherein said heat pipe susceptor has a cylindrical top and a cylindrical base, said base being an integral part of said top and having a diameter substantially less than the top.

3. In an improved chemical vapor deposition system as defined in claim 1 wherein said heat pipe susceptor has a frustum shaped top with a plurality of inwardly angled faces thereon for holding substrates and an integral base attached to said top.

* * * * *